United States Patent [19]
Astridge

[11] Patent Number: 5,220,287
[45] Date of Patent: Jun. 15, 1993

[54] VOICE PROCESSING APPARATUS

[75] Inventor: Robert F. Astridge, Wentworth Falls, Australia

[73] Assignee: Audion Pty. Ltd., Armidale, Australia

[21] Appl. No.: 837,020

[22] Filed: Feb. 18, 1992

[30] Foreign Application Priority Data

Feb. 19, 1991 [AU] Australia .................. PK4676

[51] Int. Cl.[5] .................................. H03G 3/32
[52] U.S. Cl. ......................... 330/132; 330/136; 381/110
[58] Field of Search ........... 330/129, 132, 136, 279; 381/104, 107, 109, 110, 120, 121, 122

[56] References Cited

U.S. PATENT DOCUMENTS 3,918,003 11/1975 Seidel ........................ 330/136 X
4,926,484 5/1990 Nakano ....................... 381/110 X

*Primary Examiner*—Steven Mottola
*Attorney, Agent, or Firm*—David O'Reilly

[57] ABSTRACT

A voice processing apparatus, comprising
an input terminal to receive electrical voice signals;
a controlled-gain amplifier to amplify the electrical voice signals in dependence on a control signal to provide an output signal at an output terminal; and a control means to generate the control signal from the electrical voice signals. Wherein the control means includes: a notch filter with a passband within the range 550 to 950 Hz to produce a bandwidth reduced version of the electrical voice signals; a comparator/-trigger circuit to receive the bandwidth reduced version of the electrical voice signals and to generate a trigger signal when the signal level of the bandwidth reduced version exceeds a preselected threshold; and a control signal generator to receive the trigger signal and in response thereto generate a first control signal, and in the absence of the trigger signal to generate a second control signal.

18 Claims, 4 Drawing Sheets

VOICE PROCESSING APPARATUS

TECHNICAL FIELD

This invention concerns a voice processing apparatus for use in public address and sound recording systems. The apparatus has particular utility in noisy environments, and where there may be a number of sequential speakers.

BACKGROUND ART

In environments such as courtrooms, one advocate, then another, then a witness, then the judge may all speak, from different locations in the room, one after the other. The speeches are often accompanied by a high degree of paper rustle as files are referred to, and by other noise generated from the people in the courtroom. External low frequency noise caused by traffic or aircraft overflight may also be present.

The sound amplification and recording system in such an environment will typically comprise a series of microphones placed at different locations around the room. All the microphones are connected via a switching station to mixers, amplifiers, and loudspeaking and recording equipment. Typically the switching station is controlled by an operator who observes the activity in the courtroom and switches the microphones on and off as appropriate. The performance of such a system is highly dependent on the operator's skill, and requires the concentrated attention of the operator for long periods of time if high quality is to be sustained.

SUMMARY OF THE INVENTION

According to the present invention, as currently envisaged, there is provided a voice processing apparatus, comprising:
an input terminal to receive electrical voice signals;
a controlled-gain amplifier to amplify the electrical voice signals in dependence on a control signal to provide an output signal at an output terminal; and
a control means to generate the control signal from the electrical voice signals;
wherein the control means includes:
a notch filter with a passband within the range 550 to 950 Hz to produce a bandwidth reduced version of the electrical voice signals;
a comparator/trigger circuit to receive the bandwidth reduced version of the electrical voice signals and to generate a trigger signal when the signal level of the bandwidth reduced version exceeds a preselected threshold; and
a control signal generator to receive the trigger signal and in response thereto generate a first control signal, and in the absence of the trigger signal to generate a second control signal.

The inventor has discovered from consideration of the audible frequency spectrum that signals in the frequency band between 550 Hz and 950 Hz contain significantly higher energies of vocal signals than common background noises such as traffic rumble and paper rustle. Signals within this range of frequencies can therefore be used to identify the onset of speech in a reliable and rapid manner, even in the presence of background noise, which in some circumstances can be quite loud.

Apparatus embodying the invention operates to detect speech and to switch the voltage controlled amplifier to full volume output at the instance speech commences. This may be achieved without the loss of even the first syllable of the commencing speech, and without any perceivable switching noises.

When speech ceases the apparatus may reduce the gain of the voltage controlled amplifier in a controlled manner over a predetermined period of time. In this way recommencement of speech within a short period of time will find the amplifier still partially powered-up.

The controlled-gain amplifier preferably comprises a linear amplifier having a signal input connected to a signal input terminal, and connected to a reference potential via a voltage controlled resistor; the control electrode of the voltage controlled resistor being connected to a control signal terminal, and via a PN junction to the input signal terminal; this involves a further aspect of the present invention.

BRIEF DESCRIPTION OF THE DRAWINGS

The invention will now be described by way of example only with reference to the accompanying drawings, in which.

DETAILED DESCRIPTION OF THE PREFERRED EMBODIMENTS

Figure 1:
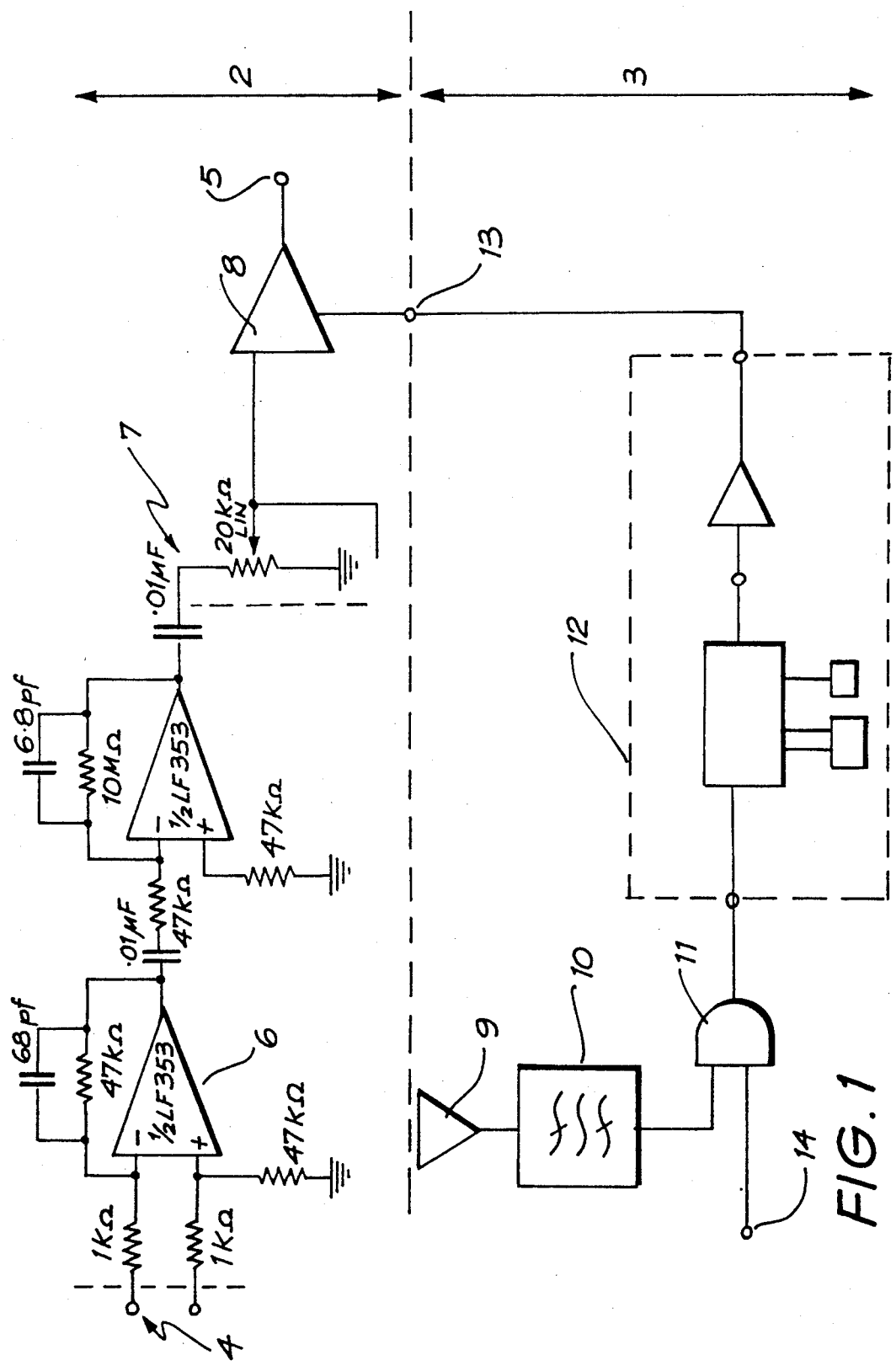
FIG. 1 is a schematic view of a voice processing apparatus embodying the present invention.

Referring now to FIG. 1, voice processing apparatus 1 comprises a signal section 2 and a control and decision section 3. The signal section 2 comprises shielded microphone input terminals 4 and an output terminal 5 interconnected by an input differential amplifier 6, a potentiometer 7 and a voltage controlled amplifier 8.

The wiper of potentiometer 7 is also connected to the control and decision section 3. In particular, any signal on the wiper is fed to an amplifier 9, a notch filter 10, and a comparator/trigger circuit 11. A trigger signal from comparator/trigger 11 is fed to a control signal generator 12, which generates a control signal and applies it to a control input 13 of voltage controlled amplifier 8.

In use, a conventional dynamic balanced microphone will be connected to input terminals 4 and any signal generated by the microphone is amplified by differential amplifier 6 and divided by a manual control which incorporates potentiometer 7. The signal is then amplified by amplifier 8 depending upon the value of the control signal arriving at its control terminal 13. Amplifier 8 may be in a zero gain state at which a null output appears at terminal 5, or at a maximum amplification state, or at any value between the two.

The signal appearing on the wiper of potentiometer 7 is also fed to amplifier 9 and is further amplified, and then filtered by notch filter 10 having a passband in the range 550 to 950 Hz. The notch filter 10 produces a bandwidth reduced version of the signal which is indicative of the presence of speech notwithstanding the appearance of both low and high frequency noise.

This bandwidth reduced version of the signal is then compared with a threshold value appearing at a second terminal 14 of comparator 11. If the bandwidth reduced signal exceeds the value of the threshold at terminal 13 a trigger signal is continually generated and applied to the control signal generator 12.

In practice the threshold at terminal 14 of the comparator 11 is set, in conjunction with the other components, such that when normal speech commences in the vicinity of a microphone connected to input terminals 4, the trigger signal is generated and continues to be generated whilst the speech continues. Extraneous, and background noise do not trigger the same response as they are excluded by notch filter 10, and the sensitivity of the apparatus may also be set to exclude normal speech occuring further than an appropriate distance from the microphone.

This ensures that the trigger signal is developed during speech, but not in the absence of speech notwithstanding the presence of noise.

The presence of the trigger signal causes the control signal generator 12 to generate a control signal at the first level which, when applied to voltage controlled amplifier 8 maintains it in its normal state of maximum amplification.

When speech stops and the trigger signal is no longer sent from comparator/trigger circuit 11 to control signal generator 12 and the control signal generator 12, which will be described in further detail below, operates to vary the amplitude of the control signal away from the first level toward the second level. This variation causes a gradual decrease in amplification by voltage controlled amplifier 8. Eventually in the absence of speech signals at input terminals 3 the amplification factor of amplifier 8 will reduce to zero and a null output will be delivered to output terminal 5. If at any time speech is recommenced the trigger signals will again be sent and the amplifier will return to maximum amplification. The effect of this is that during short pauses in the speech the amplification level may fall slightly, but will be able to recover very rapidly should speech recommence.

Figure 2:
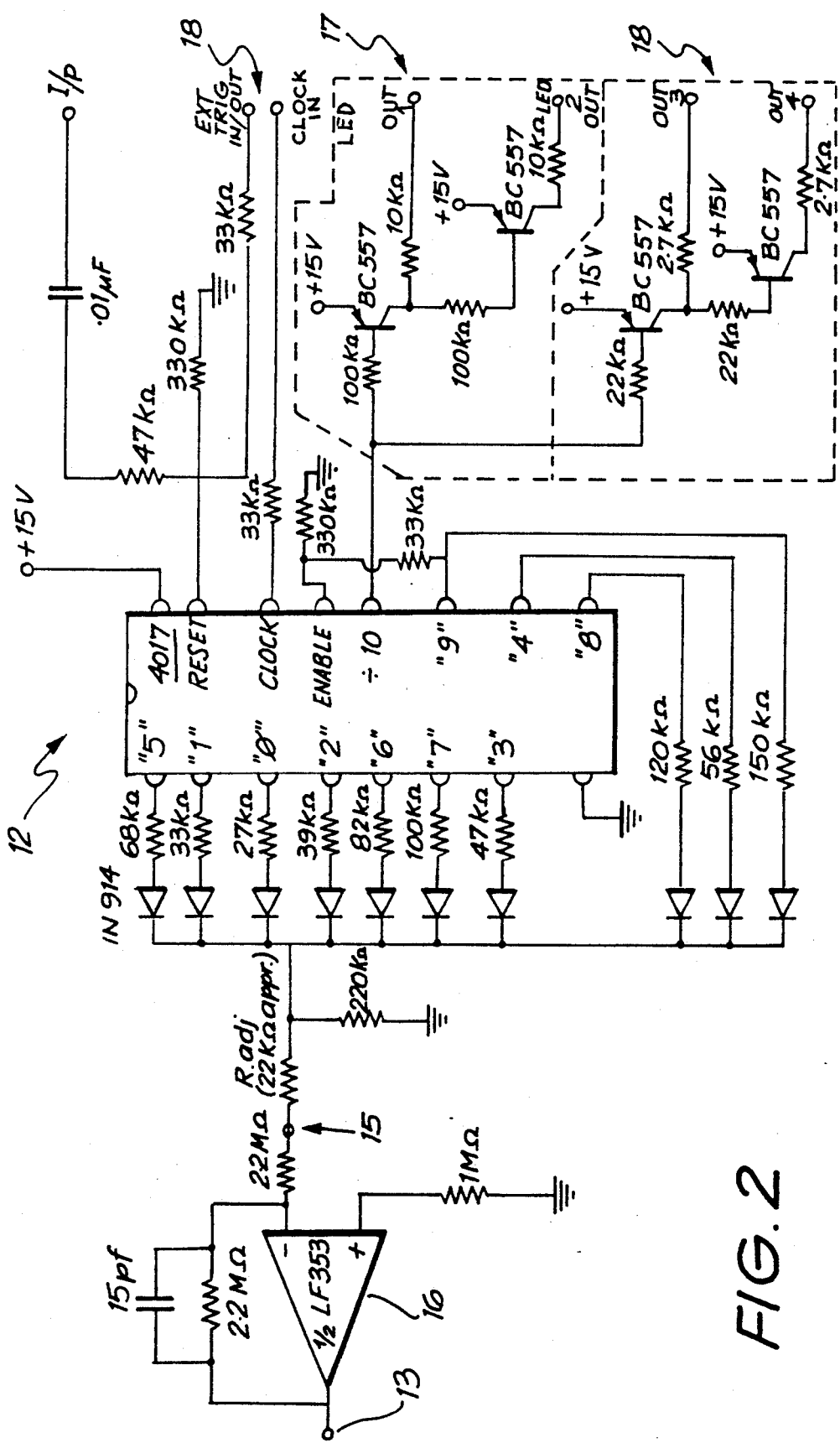
FIG. 2 is a circuit diagram of a preferred form of the control signal generator means of FIG. 1.

Referring now to FIG. 2, the control signal generator 12 will be described in greater detail. The heart of the control signal generator 12 comprises an integrated circuit of the type known as a "one of ten output". This type of microprocessor has ten output terminals "0" to "9". Each output is connected to a series arrangement of a resistor and diode, and the anodes of all the diodes are connected to node 15. The values of the resistors are selected such that when an output appears on the "0" terminal a high dc voltage level appears at node 15, when an output appears at the "1" terminal a lower output voltage appears at node 15, and so on until the lowest output voltage appears at node 15 when an output appears on terminal "9".

The integrated circuit is arranged such that when a trigger signal appears at the "RESET" terminal, an output appears at the "0" terminal. This output remains during the first clock pulse arriving at the "CLOCK" terminal but, unless another trigger signal arrives, the output disappears when the next clock pulse arrives. Throughout the next clock pulse an output appears at the "1" terminal, and when the next clock pulse arrives the output appears at the "2" terminal and so on. In this way unless the integrated circuit is reset the output eventually steps down to the lowest voltage at node 15 and the output then remains at that level. This is ensured by the resistor which straps the "9" terminal to the "ENABLE" terminal, and disables the clock from causing any further stepping once it reaches this stage.

In use, a clock signal having a period of about 300 milliseconds is used to step the dc voltage level at node 15 from the highest level to the lowest level over three seconds when trigger pulses are not being received from the comparator/trigger circuit 11. In order to prevent switching noise from appearing in the signal at node 15, a sine wave or quasi-sine wave is used for the clock signal, instead of the conventional square wave.

The signal at node 15 is inverted and scaled by inverting DC amplifier 16, before being applied to the controlling terminal 13 of voltage controlled amplifier 8.

The integrated circuit is also able to incorporate some other output functions, such as driving LED indicators 17 and controlling other microphone channels 18, in addition it may allow for an external control to turn the signal level up or down.

Figure 3:
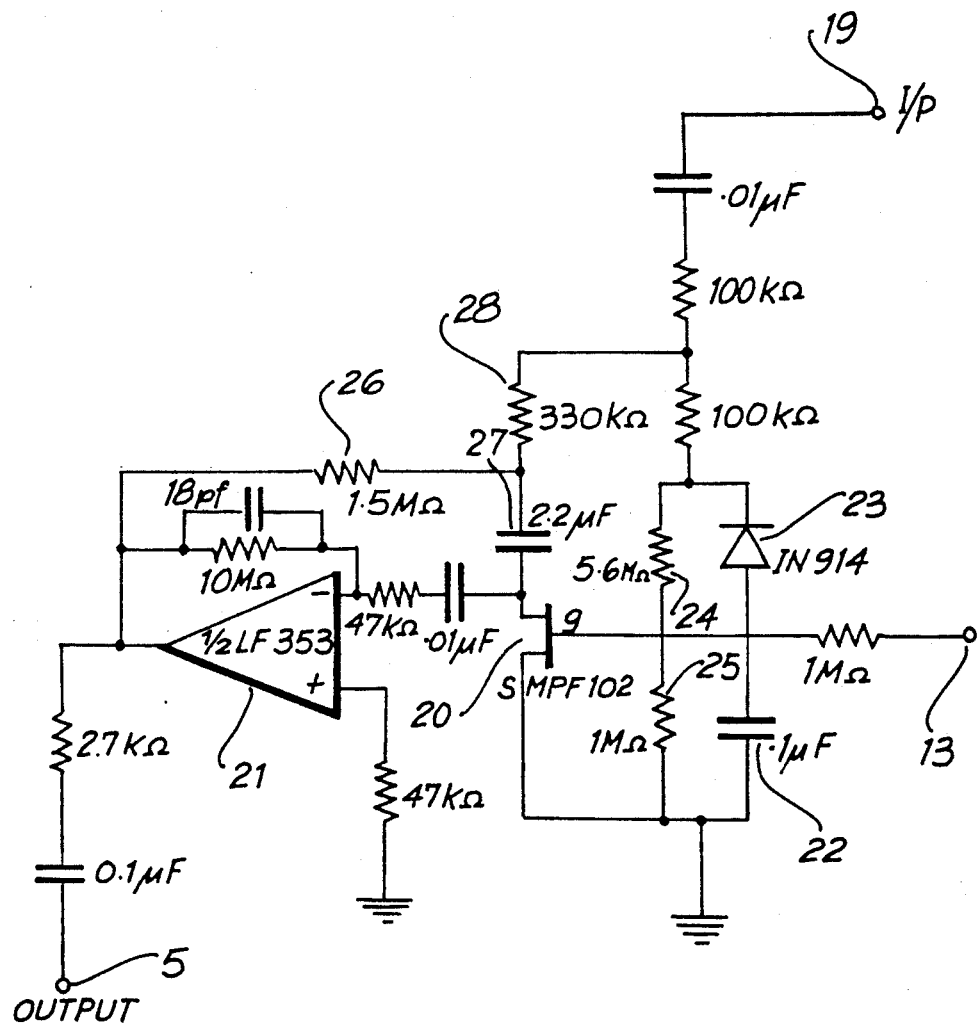
FIG. 3 is a circuit diagram of a preferred form of the controlled-gain amplifier of FIG. 1, and which embodies a further aspect of the present invention.

Voltage controlled amplifier 8 will now be described with reference to FIG. 3. The amplifier comprises a signal input terminal 19 connected to the wiper of potentiometer 7, a control voltage terminal 13 connected to the output of control signal generator 12, and an output terminal 5. The amplifier includes a Field Effect Transistor (FET) 20 which is operated in voltage controlled resistance mode; the value of the resistance being dependent on both the control signal at terminal 13 and the input signal at terminal 19. In this way the amplifier operates to provide rapid switching ON of the amplification stage provided by op-amp 21 and its associated linear feedback circuitry. Extraordinary feedback associated with op-amp 21 provides additional compensation to cater for rapid changes in signal input levels.

In greater detail, the control signal applied to terminal 13 appears across the capacitor 22, having a value of 0.1 mF. Diode 23 converts the signal appearing at input terminal 19 to a DC level which is applied as an additional voltage to capacitor 22, causing voltage changes at the gate of FET 20. A resistor 24, having a value of 5.6M ohm, is connected in parallel with diode 22 to reduce the forward/reverse resistance ratio of diode 23, thus preventing any DC level shift from the input terminal 19 from having too long an effect on the overall DC voltage.

Resistor 26, typically having a value of 1.5M ohm, provides negative feedback from op-amp 21 to eliminate any problems associated with sudden changes in input signal level.

Capacitor 27, typically having a value of 2.2 mF blocks DC from the drain terminal of FET 20 whilst allowing the resistive division of the AC input signal by the FET and resistor 28, typically having a value of 330k ohm.

The output from the system may be fed to a mixer along with the outputs from other microphones and their associated circuitry, or it may be used independently, depending on user requirements.

Figure 4:
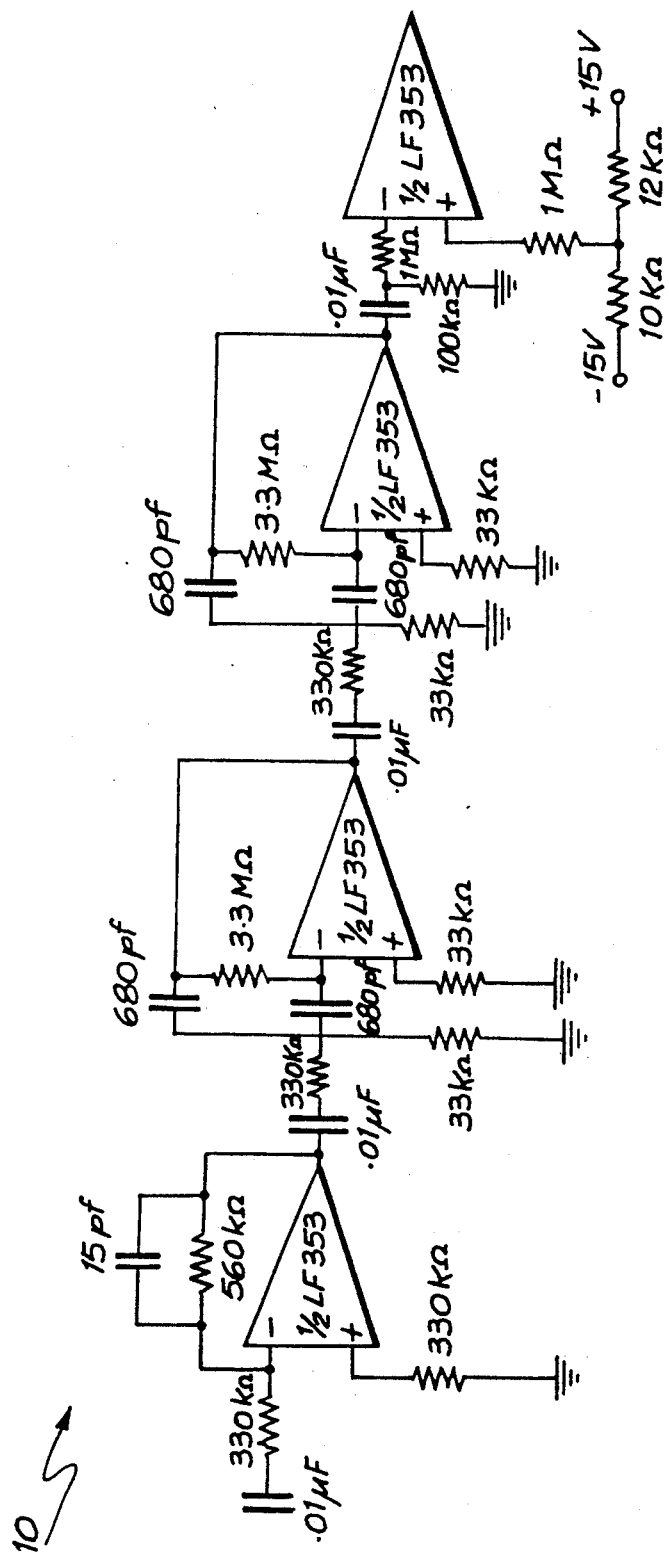
FIG. 4 is a circuit diagram of a preferred form of the notch filter of FIG. 1.

The notch filter 10 is of a conventional multistage design, each stage being slightly detuned to broaden bandwidth. However, for the sake of completeness a circuit diagram is included as FIG. 4.

What we claim is:
1. A voice processing apparatus, comprising
   an input terminal to receive electrical voice signals;
   a controlled-gain amplifier to amplify the electrical voice signals in dependence on a control signal to provide an output signal at an output terminal; and
   a control means to generate the control signal from the electrical voice signals;

wherein the control means includes:
a notch filter with a passband within the range 550 to 950 Hz to produce a bandwidth reduced version of the electrical voice signals;
a comparator/trigger circuit to receive the bandwidth reduced version of the electrical voice signals and to generate a trigger signal when the signal level of the bandwidth reduced version exceeds a preselected threshold; and
a control signal generator to receive the trigger signal and in response thereto generate a first control signal, and in the absence of the trigger signal to generate a second control signal.

2. A voice processing apparatus according to claim 1, wherein the first control signal has a first level and the second control signal varies from the first level to a second level over a predetermined period of time.

3. A voice processing apparatus according to claim 1 or 2, wherein in the absence of the trigger signal the second control signal varies from the first level to the second level in steps determined by a clock signal having a period equal to the period of each step.

4. A voice processing apparatus according to claim 3, wherein the control signal generator comprises an integrated circuit and the clock signal is provided to a clock terminal of the integrated circuit in the form of a sinewave or a quasi-sinewave.

5. A controlled-gain amplifier for a voice processing apparatus according to claim 4, comprising a linear amplifier having a signal input connected to a signal input terminal, and connected to a reference potential via a voltage controlled resistor; a control electrode of the voltage controlled resistor being connected to a control signal terminal, and via a PN junction to the signal input terminal.

6. A controlled-gain amplifier according to claim 5 wherein the PN junction comprises a diode which is connected in parallel with a resistance, and a further resistor and a capacitor are connected in parallel between the control signal terminal and the reference potential.

7. A voltage-gain controlled amplifier according to claim 5, wherein DC feedback is provided to the linear amplifier.

8. A voice processing apparatus according to claim 2, wherein the control signal generator comprises an integrated circuit and the clock signal is provided to a clock terminal of the integrated circuit in the form of a sinewave or a quasi-sinewave.

9. The voice processing apparatus according to claim 8 in which said controlled gain amplifier comprise; a linear amplifier having a signal input connected to a signal input terminal and connected to a reference potential via a voltage controlled resistor; a control electrode of the voltage controlled resistor being connected to a control signal terminal, and via a PN junction to the input signal terminal.

10. A controlled-gain amplifier according to claim 9 wherein the PN junction comprises a diode which is connected in parallel with a resistance, and a further resistor and a capacitor are connected in parallel between the control signal terminal and the reference potential.

11. A voltage-gain controlled amplifier according to claim 9, wherein DC feedback is provided to the linear amplifier.

12. A voice processing apparatus according to claim 1, wherein the control signal generator comprises an integrated circuit and a clock signal is provided to a clock terminal of the integrated circuit in the form of a sinewave or a quasi-sinewave.

13. A controlled-gain amplifier for a voice processing apparatus according to claim 12, comprising a linear amplifier having a signal input connected to a signal input terminal, and connected to a reference potential via a voltage controlled resistor; a control electrode of the voltage controlled resistor being connected to a control signal terminal, and via a PN junction to the input signal terminal.

14. A voltage-gain controlled amplifier according to claim 12, wherein DC feedback is provided to the linear amplifier.

15. A controlled-gain amplifier for a voice processing apparatus according to claim 1, comprising a linear amplifier having a signal input connected to a signal input terminal, and connected to a reference potential via a voltage controlled resistor; a control electrode of the voltage controlled resistor being connected to a control signal terminal, and via a PN junction to the input signal terminal.

16. A controlled-gain amplifier according to claim 15 wherein the PN junction comprises a diode which is connected in parallel with a resistance, and a further resistor and a capacitor are connected in parallel between the control signal terminal and the reference potential.

17. A voltage-gain controlled amplifier according to claim 15, wherein DC feedback is provided to the linear amplifier.

18. A controlled-gain amplifier according to claim 10 wherein the PN junction comprises a diode connected in parallel with a resistance, and a further resistor and capacitor connected in parallel between the control signal terminal and the reference potential.

* * * * *